United States Patent [19]

Takemura et al.

[11] Patent Number: 5,220,482

[45] Date of Patent: Jun. 15, 1993

[54] THIN FILM CAPACITOR

[75] Inventors: Kazuo Takemura; Harunobu Yoshida, both of Takarazuka; Hideo Kawahara, Minoo; Eiji Mizushima, Tokyo; Masanaga Kikuzawa, Ichikawa, all of Japan

[73] Assignee: Nippon Sheet Glass Co., Ltd., Osaka, Japan

[21] Appl. No.: 826,468

[22] Filed: Jan. 27, 1992

[30] Foreign Application Priority Data

Feb. 1, 1991 [JP] Japan ................................ 2-12213

[51] Int. Cl.$^5$ ............................................. H01G 4/06
[52] U.S. Cl. ............................................... 361/311
[58] Field of Search ....................... 361/311, 312, 313

[56] References Cited

U.S. PATENT DOCUMENTS 2,505,629  4/1950  Thomsen et al. ................... 117/124
3,113,253  12/1963  Ishikawa et al. ................... 361/313
4,015,175  3/1977  Kendall et al. ..................... 361/313
4,914,546  4/1990  Alter .................................. 361/313
4,930,044  5/1990  Eda et al. ........................... 361/313

FOREIGN PATENT DOCUMENTS 2-260621  10/1990  Japan .

Primary Examiner—Donald A. Griffin
Attorney, Agent, or Firm—Varndell Legal Group

[57] ABSTRACT

A thin film capacitor having high performances, e.g. high frequency characteristics, heat resistance and dielectric strength, and capable of meeting demands for high integration and miniaturization of electronic devices, which comprises an electrically conductive substrate, a silica thin film formed on the substrate by bringing the substrate into contact with an aqueous solution of hydrosilicofluoric acid supersaturated with silica, and an electrically conductive film formed as an electrode on the silica thin film.

9 Claims, 2 Drawing Sheets

THIN FILM CAPACITOR

BACKGROUND OF THE INVENTION

The present invention relates to a thin film capacitor using silicon dioxide as a dielectric, and more particularly to a thin film capacitor which includes a thin film layer of silicon dioxide having excellent electric characteristics and which is suitable for use in high integrated circuits.

Capacitors are passive elements or parts indispensable to electric and electronic circuits and perform various functions in the circuits in combination with resistor, coil, IC and the like. A number of main functions in electronic circuits, including filter for removing noises in power circuit, oscillation circuit for stably generating necessary signals, tuning circuit for selecting necessary signals and by-pass circuit for temperature compensation of circuits, largely depend on the characteristics of capacitors.

In general, capacitors have a structure that a dielectric is sandwiched between a pair of parallel electrodes, and function to store electricity utilizing an electrical polarization caused in the dielectric by application of a voltage between the parallel electrodes. The characteristics of the capacitors largely vary depending on the kinds of dielectrics used. At present, ceramic capacitors using dielectric ceramics, typically barium titanate, semiconductor ceramic capacitors utilizing semiconductive properties produced by addition of lanthanum oxide to barium titanate, film capacitors using plastic films such as polystyrene or polyethylene terephthalate as dielectrics, and aluminum electrolytic capacitors using as the dielectric layer a porous layer produced by anodic oxidation of the surface of highly pure aluminum foils have been used properly in accordance with purpose in consideration of temperature coefficient of capacitance, insulation resistance, dielectric loss and high-frequency characteristics of capacitors.

In recent years, demands for high intergration and high performance of electronic devices and equipments are increasing more and more. Accordingly, miniaturization, lightening, multifunctionalization and high reliability have been demanded also with respect to capacitors. However, various problems are encountered in achieving these demands. For example, a problem of heat release encountered in high integration must be solved. This problem may be dealt with by circuit design and packaging technique, e.g. low power operation and heat releasable structure, but basically the solution by realization of capacitors resistant to high temperature operation is required. Also, high integration always includes high speeding of circuit operation, and it is becoming very important to meet an increase in frequency of dealt signals. For example, in computers which are a representative example of electronic devices and equipments, operating frequency increases more and more, and even in usual personal computers an operating frequency over 20 MHz tends to become common. Also, in the field of satellite communication or the like, operation at gigahertz (GHz) band is demanded. In such fields, it is requested that capacitors themselves do not generate waveform distortion and noise also in a high frequency region. Also, since the number of terminals increases inevitably with increase in the degree of integration, it is necessary to decrease pitches between the terminals and, therefore, new connecting means and arraying have also been demanded.

In addition to high integration, countermeasures for miniaturization and lightening have also been demanded, and it may safely be said that thin film capacitors are indispensable to production of capacitors which have a large capacitance even if they are of small area and thin types.

Paying attention to improvement in performances of capacitors required for high integration, miniaturization and so on, capacitors widely used at present have the following problems.

(1) Ceramic capacitors have the defect that the capacitance largely varies depending on temperature. Also, for obtaining a large capacitance, it is necessary to built-up thin pieces of ceramics and, therefore, ceramic capacitors have a limit in miniaturization. Further, the arraying makes process step complicated, since the arraying must be made by preparing individual built-up type capacitors and adhering them with alignment onto a common substrate such as ceramic substrate or epoxy substrate.

(2) Semiconductor capacitors have the defects that the capacitance largely varies depending on voltage and the voltage resistance is poor, in addition to the same problems as those encountered by ceramic capacitors in miniaturization and arraying.

(3) Film capacitors have an inductance and are not suitable for use at high frequency. They also have the problems that the capacitance is relatively small and the temperature of use is restricted by the kind of plastics used.

(4) Aluminum electrolytic capacitors have the problems that the applicable frequency is as low as 1 MHz or less and the temperature coefficient of capacitance is large. Also, judging from the process steps for the preparation, the arraying would be difficult.

It is a primary object of the present invention to provide a small size capacitor which can meet high integration and miniaturization of electronic devices and equipments and which has excellent high frequency characteristics as usable in a high frequency region and has a good heat resistance.

A further object of the present invention is to provide a thin film capacitor which is stable in capacitance against changes of temperature and frequency and which can meet the production of a capacitor array of high quality.

These and other objects of the present invention will become apparent from the description hereinafter.

SUMMARY OF THE INVENTION

It has been found that thin films of silicon dioxide (silica) prepared by a liquid phase deposition (LPD) process wherein silica films are deposited on surfaces of substrates by immersing the substrates into an aqueous solution of hydrosilicofluoric acid supersaturated with silica, have excellent electric characteristics, e.g. high frequency characteristics (namely low loss even in a high-frequency region), heat resistance, stability of capacitance against temperature and frequency changes, and particularly high dielectric strength, and are very suitable for use as dielectric of capacitors.

In accordance with the present invention, there is provided a thin film capacitor comprising an electrically conductive substrate, a silica thin film formed on said substrate, and an electrically conductive film formed on said silica thin film, said silica thin film being formed by bringing said electrically conductive substrate into contact with an aqueous solution of hydrosilicofluoric acid supersaturated with silica.

DETAILED DESCRIPTION

Figure 1:
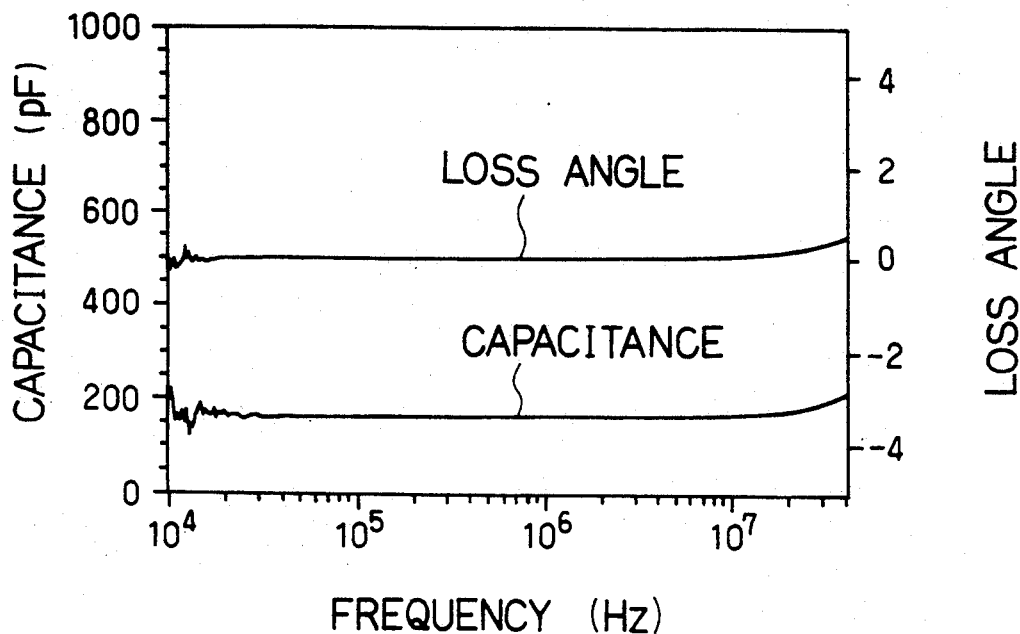
FIG. 1 is a graph showing frequency dependencies of capacitance and loss angle of a thin film capacitor prepared in Example 1 described after.

Examples of the electrically conductive substrate used in the thin film capacitor of the present invention are, for instance, a corrosion resistant metallic material, e.g. a noble metal such as gold, platinum or palladium, a metal whose oxide in the surface is chemically stable such as chromium, and a corrosion resistant alloy, typically stainless steel; a silicon wafer having a low electric resistance; and a film or sheet of a non-conductive material having an electrically conductive layer, e.g. glasses, ceramics, metals and plastics which are covered with the above-mentioned corrosion resistant metallic material or tin oxide. The thickness of the electrically conductive substrate may be those usually adopted for thin film capacitors, and is not particularly limited.

In the present invention, a thin film of silica formed by a liquid phase deposition (LPD) process is used as the dielectric of capacitors. The relative dielectric constant of silica is as small as about 5.0, but it is possible to compensate for a low relative dielectric constant, thus obtaining a high capacitance, by forming silica in the form of a thin film, especially a thin film having a thickness of not less than 10 $\mu$m. Also, silica shows a low loss even in a high frequency region. Moreover, not only the temperature coefficient of capacitance is very low, but also the frequency-capacitance characteristic is very stable. In general, silica causes a problem of dielectric strength when formed into a thin film. However, silica thin films formed by the LPD process has the advantage that the dielectric strength is about 10 MV/cm and is very higher than that of silica thin films formed by commonly used processes such as sputtering and spin coating, which is usually from 1 to 5 MV/cm. This high dielectric strength of the silica thin film obtained by the LPD process is considered to result from the features that this thin film is superior in order of atomic arrangement and pinholes are very few as compared with silica thin films formed by other processes. The silica thin films formed by the LPD process have a dielectric strength of more than 10 times the dielectric strength required for capacitors which is usually from 100 to 200 KV/cm.

The LPD process for forming thin films of silica is known, for instance, from U.S. Pat. No. 2,505,629, U.S. Pat. No. 5,073,408 and Japanese Patent Publication Kokoku No. 63-65621 and No. 1-27574. In the present invention, silica thin films are formed according to known LPD processes. That is to say, an aqueous solution of hydrosilicofluoric acid supersaturated with silica is used as the treating solution, and a silica film is formed on a conductive substrate by bringing the substrate into contact with the treating solution, typically by immersing the substrate in the treating solution, until the silica film having a desired thickness is deposited on the surface of the substrate. The preparation of the hydrosilicofluoric acid solution supersaturated with silica is not restricted to a particular manner, and known manners are applicable. For example, the supersaturated solution can be prepared by adding a reagent capable of accelerating the decomposition of hydrosilicofluoric acid ($H_2SiF_6$), e.g. boric acid, aqueous ammonia, metal halides or a metal having a larger ionization tendency than hydrogen such as aluminum, to an aqueous solution of hydrosilicofluoric acid substantially saturated with silica. It can also be obtained by preparing the substantially saturated solution at a low temperature, usually at a temperature below 35° C., and elevating the temperature of the substantially saturated solution, preferably to a temperature not exceeding 70° C. The concentration of $H_2SiF_6$ is usually at least 1.0 mole/liter, preferably from 1.0 to 4 moles/liter, more preferably from 1.5 to 3.0 moles/liter.

The temperature of the treating solution to be contacted with electrically conductive substrates, namely the temperature for depositing silica on the substrates, is from 15° to 60° C., preferably 25° C. to 40° C. In case of forming the supersaturated solution utilizing temperature difference, preferably an aqueous solution of $H_2SiF_6$ substantially saturated with silica is prepared at a temperature of not higher than 10° C. and is then heated to a temperature of 20° to 60° C. to form the supersaturated solution, and the conductive substrates are brought into contact with the supersaturated solution at that temperature.

The contacting of the electrically conductive substrate with the treating solution is usually carried out by immersing the substrate in the treating solution. When it is desired to form a silica film on a part of the substrate, for example, in case of leaving a part of the substrate in order to provide lead connecting portions, or in case of forming the silica film on one surface of the substrate, the substrate may be partly masked by a suitable means.

The thus formed silica films usually contain 1 to 2% by weight of water, and dielectric loss tends to slightly increase when they are used in thin film capacitors. Accordingly, it is preferable to heat-treat the silica films after forming them. The heat treatment (annealing) of silica films is carried out at a temperature of at least 100° C. at which water adsorbed begins to be released, preferably at a temperature of not lower than 400° C. from the viewpoint of removal of whole hydroxyl groups including silanol groups. The heat treatment time is usually from 10 minutes to 5 hours.

The thickness of the silica thin film is from 100 angstroms to 10 $\mu$m.

Since the LPD process can provide silica thin films having a uniform thickness on the whole surfaces of an electrically conductive substrate, it is possible to utilize approximately the whole surfaces, namely the both surfaces, of the substrate as the dielectric layers of capacitor, thus the capacitance can be further increased.

According to the present invention, miniaturization of electronic devices or capacitors is easy. Since the constituting materials are all in the form of thin film, a so-called capacitor array wherein an electrically conductive substrate is used as a common electrode and a plurality of electrically isolated conductive films are used as independent electrodes, can be easily obtained by forming a silica thin film on the substrate, masking a part of the surface of the silica film and forming the electrically conductive film on the exposed surface in a manner of vacuum deposition, sputtering or the like. In particular, when silica thin films are formed on both surfaces of the conductive substrate and independent electrodes are formed by plating, the electrically conductive film can be simultaneously formed on both the surface and back sides, thus a capacitor array having an increased number of capacitors can be obtained.

Usual materials can be used in the formation of the electrically conductive film as an electrode. For example, in case of forming it by vaccum deposition or sputtering method, Al, Cr, Ni, Cu, Pd, Pt, Au and the like are usually employed. In case of a wet plating method, Ni, Cu, Au and the like are usually employed. Of course, the materials used for the electrically conductive film are not restricted to these exemplified materials, The thin film capacitors of the present invention have excellent characteristics such as high frequency characteristics, heat resistance, high stability of capacitance against temperature, frequency or voltage change, and high dielectric strength, and meet demands for high integration and miniaturization of electronic devices. Also, a capacitor array having no variation in quality between individual capacitors can be easily obtained according to the present invention.

Since formation of very fine electrodes is possible according to a lithographic means using photoresist, it is also possible to provide a ultra-small size, high density capacitor array.

The present invention is more specifically described and explained by means of the following Examples. It is to be understood that the present invention is not limited to the Examples.

EXAMPLE 1

A silica gel powder was dissolved in a 3 moles/liter aqueous solution of hydrosilicofluoric acid up to saturation at 30° C. Aluminum was then dissolved in the saturated solution in an amount 0.4 g per liter of the saturated solution with stirring to form a treating solution supersaturated with silica.

A P type silicon wafer having a size of 1 cm×1 cm×0.47 mm (thickness) and a specific resistance of 0.018 $\Omega$·cm, one surface of which was masked with a plastic tape, was immersed in the treating solution at 35° C. for 6 hours to form a silica film having a thickness of 3,000 angstroms on the non-masked surface of the silicon wafer. After removing the masking tape, the silicon wafer was thoroughly washed with pure water.

An aluminum thin film electrode (1 mm×2 mm) having a thickness of 1,000 angstroms was formed on a silica thin film by vacuum deposition. Further, in order to make an ohmic contact, a gold thin film having a thickness of 2,000 angstroms was formed on the reverse side of the silicon wafer by vacuum deposition. Lead wires were then fixed onto both the aluminum thin film and the gold thin film with a silver solder.

Regarding the thus prepared sample as a thin film capacitor comprising the Al and Au films as upper and lower electrodes and the silica film as dielectric layer, the dependencies of its capacitance on temperature and frequency were measured by an impedance analyzer (HP4194 model A made by HEWLETT-PACKARD CO.).

Figure 2:
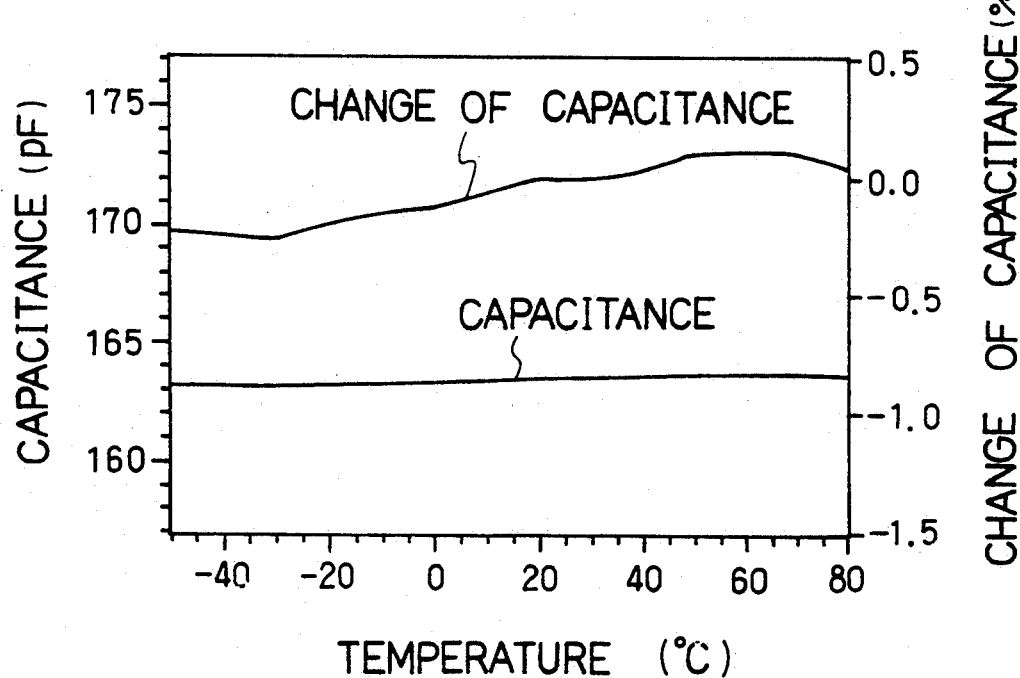
FIG. 2 is a graph showing a temperature dependency of capacitance of a thin film capacitor prepared in Example 1 described after.

The results are shown in FIGS. 1 and 2.

It was confirmed that the capacitance was about 160 pF and it was scarcely affected by temperature and frequency as apparent from FIGS. 1 and 2. It would be understood that thin film capacitors that the fluctuation in capacitance caused by temperature is a little even in a high frequency region, can be obtained by the present invention.

EXAMPLE 2

A silica film having a thickness of 1 $\mu$m was formed on each of two silicon wafers in the same manner as in Example 1. One of them was annealed in air at 500° C. for 30 minutes.

Using these two samples, two thin film capacitors were prepared in the same manner as in Example 1, and the capacitance and dielectric loss thereof were measured.

Figure 3:
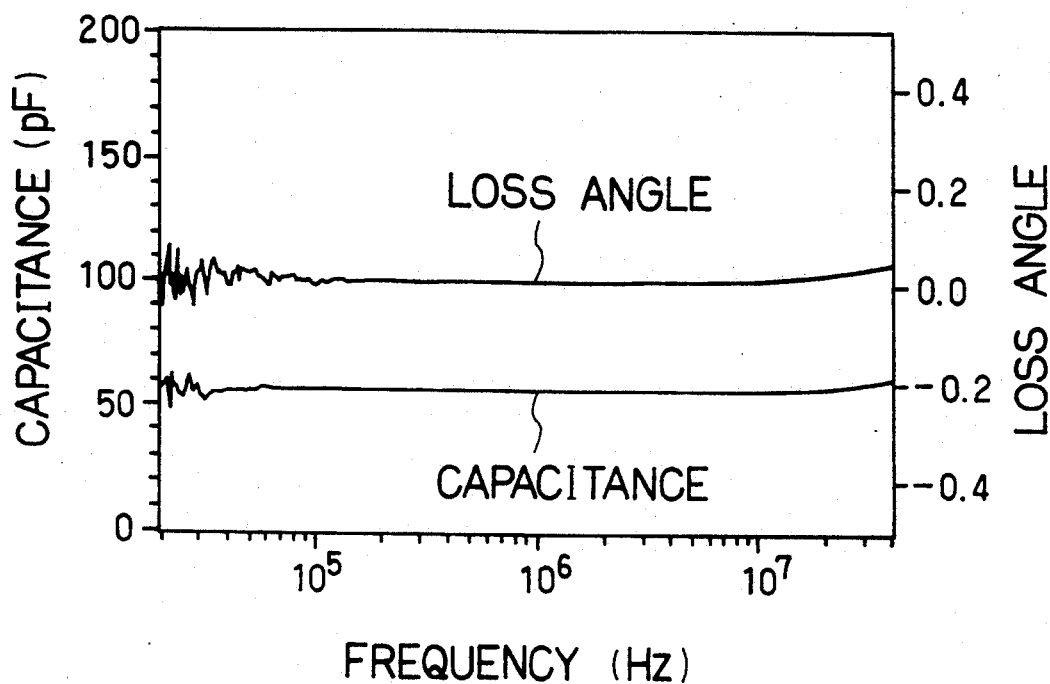
FIG. 3 is a graph showing frequency dependencies of capacitance and loss angle of a thin film capacitor prepared in Example 2 described after wherein a silica thin film is not annealed.
Figure 4:
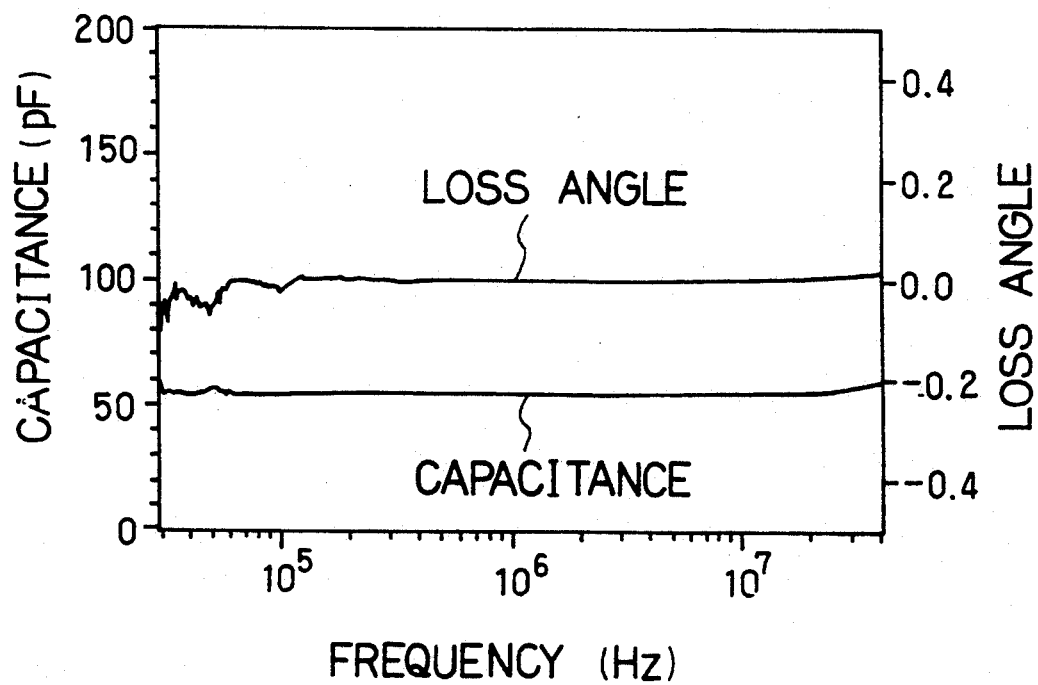
FIG. 4 is a graph showing frequency dependencies of capacitance and loss angle of a thin film capacitor prepared in Example 2 described after wherein a silica thin film is annealed.

The results are shown in FIG. 3 for the nonannealed sample and in FIG. 4 for the annealed sample. It is understood from FIGS. 3 and 4 that the dielectric loss is decreased by annealing the formed silica thin film.

EXAMPLE 3

Thin film capacitors having silica layers of 1,000 3,000, 5,000 and 10,000 angstroms in thickness were prepared according to the procedures of Example 1, and the capacitance thereof was measured at varied frequencies.

The results obtained at 1 MHz are shown in Table 1.

It is observed in Table 1 that the capacitance is approximately in inverse proportion to the thickness of silica film.

It was also confirmed that the capacitance was very stable to change of frequency. It is considered that this effect results from excellent qualities of silica thin films having no pinholes produced by LPD process.

TABLE 1

| Film thickness (Å) | Capacitance (pF) |
|---|---|
| 1,000 | 490 |
| 3,000 | 161 |
| 5,000 | 112 |
| 10,000 | 55 |

EXAMPLE 4

A glass sheet having a size of 1 cm×1 cm×1.1 mm (thickness), on one surface of which a tin oxide layer having a thickness of 1,000 angstroms and a sheet resistance of 50 $\Omega/\square$ was formed, was used as an electrically conductive substrate. On a part of the tin oxide layer, a silica thin film and an aluminum thin film were subsequently formed in the same manner as in Example 1. Lead wires were then fixed to the silica-nondeposited portion of the tin oxide layer and to the aluminum layer with a silver solder.

The characteristics of the thus prepared capacitor having a silica layer of 3,000 angstroms in thickness were measured in the same manner as in Example 1. The results showed that the obtained thin film capacitor was stable to changes in temperature and frequency.

EXAMPLE 5

A thin film of silica having a thickness of 5,000 angstroms was deposited on one surface of a P type silicon wafer having a size of 8 mm in width, 22 mm in length and 0.47 mm in thickness and having a specific resistance of 0.018 Ω·cm according to the procedure of Example 1.

The silica layer was covered with a patterned metallic mask and an aluminum thin film having a thickness of 1,000 angstroms was deposited by vacuum deposition on the silica layer through the mask to form five electrodes having a size of 1 mm×2 mm arranged in a line at intervals of 2 mm. Further, a gold thin film having a thickness of 2,000 angstroms was formed on the back side of the silicon wafer by vacuum deposition.

Regarding the thus obtained product as a capacitor array having the gold thin film as a common electrode and the five aluminum film pieces as independent electrodes, the characteristics of five capacitors were estimated in the same manner as in Example 1. Five capacitors had approximately the same characteristics, and the stability of capacitance to changes in temperature and frequency agreed to the tendency shown in FIGS. 1 and 2.

In addition to the ingredients used in the Examples, other ingredients can be used in the Examples as set forth in the specification to obtain substantially the same results.

What we claim is:

1. A thin film capacitor comprising an electrically conductive substrate, a silica thin film formed on said substrate, and an electrically conductive film formed on said silica thin film, said silica thin film being formed by bringing said electrically conductive substrate into contact with an aqueous solution of hydrosilicofluoric acid supersaturated with silica.

2. The capacitor of claim 1, wherein said electrically conductive substrate is a member selected from the group consisting of a corrosion resistant metallic material, a silicon wafer having a low electric resistance, and a film or sheet of a non-conductive material having an electrically conductive layer.

3. The capacitor of claim 2, wherein said corrosion resistant metallic material is a member selected from the group consisting of a corrosion resistant noble metal, a corrosion resistant metal whose oxide in the surface is chemically stable, and a corrosion resistant metallic alloy.

4. The capacitor of claim 2, wherein said corrosion resistant metallic material is a member selected from the group consisting of gold, platinum, palladium, chromium and stainless steel.

5. The capacitor of claim 2, wherein said film or sheet of a non-conductive material having an electrically conductive layer is a film or sheet of a material selected from the group consisting of glasses, ceramics, metals and plastics which has an electrically conductive layer of a material selected from the group consisting of a corrosion resistant metallic material and tin oxide.

6. The capacitor of claim 1, wherein said silica thin film is heat-treated at a temperature of not less than 100° C. after the formation thereof.

7. The capacitor of claim 1, wherein said silica thin film is formed on the entire surface of said substrate excepting a portion for lead connection, and said electrically conductive film is formed as an upper electrode on a part or entire of said silica thin film.

8. The capacitor of claim 1, wherein said electrically conductive film is formed as a plurality of independent electrodes on said silica thin film.

9. The capacitor of claim 1, wherein said silica thin film has a dielectric strength of about 10 MV/cm.

* * * * *